(12) United States Patent
Zhao et al.

(10) Patent No.: US 11,127,919 B2
(45) Date of Patent: Sep. 21, 2021

(54) OLED LIGHT EMITTING MODULE AND DISPLAY DEVICE HAVING METAL STACK INCLUDING SANDWICHED INVAR ALLOY, AND MANUFACTURING METHOD THEREOF

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Lihao Zhao, Beijing (CN); Biao Tian, Beijing (CN); Jianhui Zhang, Beijing (CN); Yong Cui, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 102 days.

(21) Appl. No.: 16/426,732

(22) Filed: May 30, 2019

(65) Prior Publication Data

US 2020/0058897 A1 Feb. 20, 2020

(30) Foreign Application Priority Data

Aug. 14, 2018 (CN) .......................... 201810922624.7

(51) Int. Cl.
*H01L 51/52* (2006.01)
*H01L 27/32* (2006.01)
*H01L 51/56* (2006.01)

(52) U.S. Cl.
CPC ...... *H01L 51/5237* (2013.01); *H01L 27/3241* (2013.01); *H01L 51/529* (2013.01); *H01L 51/56* (2013.01)

(58) Field of Classification Search
CPC ... H01L 51/5237; H01L 51/529; H01L 51/56; H01L 27/3241
See application file for complete search history.

(56) References Cited

U.S. PATENT DOCUMENTS

| | | |
|---|---|---|
| 6,355,364 B1 | 3/2002 | Japp et al. |
| 2011/0187629 A1 | 8/2011 | Nam et al. |
| 2012/0313137 A1* | 12/2012 | Shin .................... H01L 51/5243 257/100 |

FOREIGN PATENT DOCUMENTS

CN 102820432 A 12/2012

OTHER PUBLICATIONS

Dan Wu et al., "Effects of rolling and annealing on microstructures and properties of Cu/Invar electronic packaging composites prepared by powder metallurgy", Transactions of Nonferrous Metals Society of China, vol. 25, Issue 6, pp. 1995-2002 (Year: 2015).*

(Continued)

*Primary Examiner* — Matthew E. Gordon
(74) *Attorney, Agent, or Firm* — Myers Bigel, P.A.

(57) ABSTRACT

The present disclosure relates to the field of display technologies, and provides an OLED light emitting module, a manufacturing method thereof, and a display device. The OLED light emitting module includes a base substrate, an OLED light emitting device on the base substrate, and a metal stack on the OLED light emitting device. The metal stack includes a first metal layer, a second metal layer and a third metal layer arranged in stack. The second metal layer includes an invar alloy. The first metal layer and the third metal layer include a metal material different from the invar alloy.

13 Claims, 2 Drawing Sheets

(56) References Cited

OTHER PUBLICATIONS

U.S. Trademark Reg. No. 63,970 for "INVAR" (Year: 1907).*
First Office Action and English language translation, CN Application No. 201810922624.7, Mar. 20, 2020, 14 pp.
Wu et al., "Effects of rolling and annealing on microstructures and properties of Cu/Invar electronic packaging composites prepared by powder metallurgy", Transactions of Nonferrous Metals Society of China, vol. 25, No. 6, Jun. 2015, pp. 1995-2002.

* cited by examiner

US 11,127,919 B2

OLED LIGHT EMITTING MODULE AND DISPLAY DEVICE HAVING METAL STACK INCLUDING SANDWICHED INVAR ALLOY, AND MANUFACTURING METHOD THEREOF

CROSS REFERENCE TO RELATED APPLICATIONS

The present application claims the priority of the Chinese patent application No. 201810922624.7 filed on Aug. 14, 2018, the entire disclosure of which is incorporated herein by reference.

TECHNICAL FIELD

The present disclosure generally relates to the field of display technologies, and in particular to an OLED light emitting module, a manufacturing method thereof, and a display device.

BACKGROUND ART

Conventionally, most large-sized organic light-emitting diode (OLED for short) devices are encapsulated by bonding a glass cover plate and a base plate together. Although such encapsulation helps to obtain a transparent encapsulation layer for example, it generally involves a greater thickness, which is disadvantageous to manufacture of an ultra-thin device. It has been proposed that a metal encapsulation film can be used to replace the expensive glass cover plate. But conventional metal materials (e.g., Ag, Cu and so on) all have relatively higher expansion coefficients, and hence are apt to cause problems such as device warpage.

Therefore, how to further improve heat dissipation performance of the OLED light emitting device, eliminate warpage of the device, decrease thickness of the device and reduce manufacture costs while ensuring effective encapsulation of the device is a technical problem that those skilled in the art try hard to solve.

SUMMARY

According to an aspect of the present disclosure, an OLED light emitting module is provided in embodiments. Specifically, the OLED light emitting module comprises: a base substrate; an OLED light emitting device on the base substrate; and a metal stack for encapsulating the OLED light emitting device. Furthermore, the metal stack comprises a first metal layer, a second metal layer and a third metal layer arranged in stack, wherein the second metal layer comprises an invar alloy, and the first metal layer and the third metal layer comprise a metal material different from the invar alloy.

According to a specific implementation, in the OLED light emitting module provided by embodiments of the present disclosure, the first metal layer and the third metal layer comprise the same metal material.

According to a specific implementation, in the OLED light emitting module provided by embodiments of the present disclosure, the first metal layer and the third metal layer comprise copper, aluminum or silver, and a thickness ratio between the first metal layer, the second metal layer and the third metal layer is in a range from about 1:8:1 to about 1:20:1.

According to a specific implementation, in the OLED light emitting module provided by embodiments of the present disclosure, the second metal layer is formed by performing a cold rolling process on the invar alloy, and the first metal layer and the third metal layer are formed on two opposite sides of the first metal layer by an electroplating process or an electroless plating process.

According to a specific implementation, in the OLED light emitting module provided by embodiments of the present disclosure, the metal stack is formed by a rolling bonding process, such that there is a predetermined thickness ratio between the first metal layer, the second metal layer and the third metal layer.

According to a specific implementation, the OLED light emitting module provided by embodiments of the present disclosure further comprises an adhesive layer between the OLED light emitting device and the metal stack.

According to a specific implementation, in the OLED light emitting module provided by embodiments of the present disclosure, the adhesive layer has a thickness of 30-80 µm.

According to a specific implementation, in the OLED light emitting module provided by embodiments of the present disclosure, the adhesive layer is formed by a thermoplastic adhesive or a thermosetting adhesive. Specifically, the thermoplastic adhesive comprises any one of polyvinyl acetate, polyvinyl alcohol, polyvinyl formal, polypropylene, polyethylene, polyvinyl chloride, polyurethane, polyamide, and saturated polyester. Furthermore, the thermosetting adhesive comprises any one of urea resin, phenolic resin, resorcinol resin, melamine resin, epoxy resin, unsaturated polyester, polyisocyanate, and furan resin.

According to a specific implementation, the OLED light emitting module provided by embodiments of the present disclosure further comprises a passivation layer between the OLED light emitting device and the adhesive layer.

According to a specific implementation, in the OLED light emitting module provided by embodiments of the present disclosure, the OLED light emitting device comprises: an anode, a hole injection layer, a hole transport layer, a light emitting layer, an electron transport layer, an electron injection layer and a cathode arranged sequentially in stack; and a driver for driving the OLED light emitting device to emit light.

According to another aspect of the present disclosure, a manufacturing method for an OLED light emitting module is further provided in embodiments. Specifically, the manufacturing method comprises steps of: providing a base substrate; forming an OLED light emitting device on the base substrate; and encapsulating the OLED light emitting device with a metal stack. Furthermore, the metal stack comprises a first metal layer, a second metal layer and a third metal layer arranged in stack, wherein the second metal layer is formed by an invar alloy, and the first metal layer and the third metal layer are formed by a metal material different from the invar alloy.

According to a specific implementation, in the manufacturing method for an OLED light emitting module provided by embodiments of the present disclosure, the first metal layer and the third metal layer comprise the same metal material.

According to a specific implementation, the manufacturing method for an OLED light emitting module provided by embodiments of the present disclosure further comprises forming the metal stack through the following steps: firstly forming an invar alloy layer by a cold rolling process, and then forming the first metal layer and the third metal layer respectively on two opposite sides of the invar alloy layer by an electroplating process or an electroless plating process.

According to a specific implementation, the manufacturing method for an OLED light emitting module provided by embodiments of the present disclosure further comprises: forming the metal stack by a rolling bonding process, such that there is predetermined thickness ratio between the first metal layer, the second metal layer and the third metal layer.

According to a specific implementation, the manufacturing method for an OLED light emitting module provided by embodiments of the present disclosure further comprises forming a passivation layer on the OLED light emitting device prior to encapsulating the OLED light emitting device with the metal stack.

According to a specific implementation, in the manufacturing method for an OLED light emitting module provided by embodiments of the present disclosure, the step of encapsulating the OLED light emitting device with a metal stack comprises: bonding an adhesive layer onto the metal stack by a rolling lamination process; and encapsulating the metal stack and the adhesive layer as bonded onto the base substrate by a rolling lamination process or a vacuum assembling process.

According to yet another aspect of the present disclosure, a display device is provided in embodiments, which display device comprises the OLED light emitting module as provided in any of the above embodiments.

BRIEF DESCRIPTION OF DRAWINGS

In order to help to understand the present disclosure more comprehensively, detailed depictions are given as follows with reference to the drawings. It should be pointed out that throughout the description and different drawings, same reference signs are used to indicate elements or components having a same structure or function.

DETAILED DESCRIPTION

It should be understood that although exemplary schemes of one or more embodiments of the present disclosure are illustrated below in detail, the module and manufacturing method disclosed herein can be implemented by any other suitable techniques that have already been known or not. Therefore, the present disclosure is not limited to the exemplary schemes described below in any sense. Instead, it can be suitably modified within the scope of the appended claims and equivalent solutions thereof.

As mentioned above, in order to avoid warpage, it is reported that invar alloys having lower expansion coefficients are used to form the metal encapsulation film. However, pure invar alloys have lower thermal conductivity coefficients, and thus the OLED light emitting device has a poor heat dissipation performance, which influences the service life of the entire device.

The OLED light emitting module provided by embodiments of the present disclosure and the manufacturing method thereof will be explained and described in the following and in detail with reference to the drawings.

Figure 1:
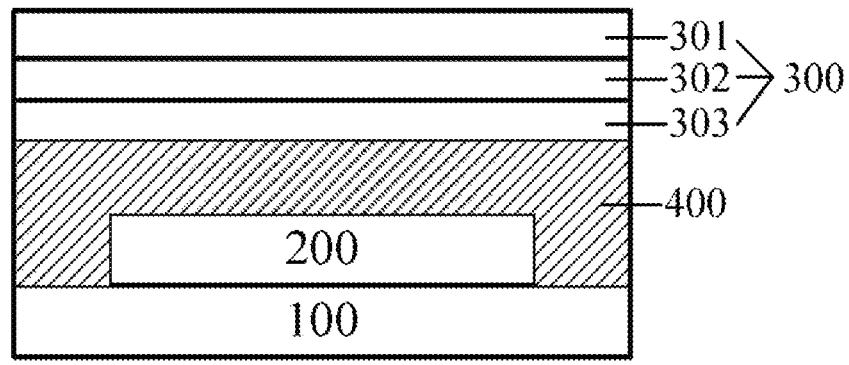
FIG. 1 schematically shows a section view of the OLED light emitting module according to an embodiment of the present disclosure.

Referring to FIG. 1, a section view of the OLED light emitting module according to an embodiment of the present disclosure is shown schematically. Specifically, as shown in FIG. 1, the OLED light emitting module can comprise a base substrate 100, an OLED light emitting device 200, an optional adhesive layer 400 and a metal stack 300 arranged sequentially in an upward direction from below. The metal stack 300 located uppermost is used for providing encapsulation to the OLED light emitting device 200, and optionally, for cooperating with the adhesive layer 400 to accomplish the encapsulation procedure. As can be seen from FIG. 1, the metal stack 300 can comprise three sublayers arranged in stack, i.e., a first metal layer 301, a second metal layer 302 and a third metal layer 303, wherein the second metal layer 302 is formed by an invar alloy, and the first metal layer 301 and the third metal layer 303 are formed by a further and optionally same metal material. The invar alloy typically includes around 36% nickel and 64% iron.

As can be seen from above, in the OLED light emitting module provided by embodiments of the present disclosure, encapsulation of the OLED light emitting device is realized by using a metal stack 300 with three sublayers, rather than using an ordinary glass cover plate, a single metal film or any other film material. Moreover, the metal stack 300 is formed by two outer layers, such as having a same material, and an invar alloy layer sandwiched therebetween. By providing two metal layers made of another metal material (e.g., having a better heat conduction performance than invar alloys) respectively on two opposite sides of the invar alloy layer, a metal stack comprising a spatial distribution of different metal materials can be obtained, which can have a higher thermal conductivity than a single invar alloy layer. In this case, if such a metal stack is further used to encapsulate the OLED light emitting device, not only can the effective encapsulation of the OLED light emitting module be ensured, but also the heat dissipation effect of the OLED light emitting device can be improved, because the composite metal stack has a better heat conduction performance than a single invar alloy layer. Finally, this will help to improve the service life of the light emitting device or the entire light emitting module.

Besides, as compared with a conventional glass cover plate, the metal material layer generally has a smaller thickness and lower manufacture costs. Thus, by encapsulating the OLED light emitting device with a metal stack 300 comprising an invar alloy, the present disclosure can also help to reduce the production costs of the final OLED light emitting module and furthermore the light emitting system, and further help to thin the entire thickness thereof.

Finally, it should be further pointed out that according to an embodiment of the present disclosure, in the metal encapsulation stack of the OLED light emitting module, the two sublayers located on the outer sides are symmetrical with respect to the invar alloy layer at the central position, for example because the first metal layer and the third metal layer located on the outer sides are especially made of a same metal material. Besides, as is well known for those skilled in the art, the invar alloy located in the center has a relatively lower thermal expansion coefficient, typically in a range of 0-4 ppm/° C. This means that even if thermal expansion effects occur, the metal layers symmetrically arranged on both sides (i.e., the first metal layer and the third metal layer) can counteract or compensate each other, and meanwhile the invar alloy layer located in the center maintains a relatively smaller thermal expansion. In this case, the entire metal stack will exhibit a relatively smaller thermal expansion coefficient, which ensures that the final light emitting device or module has extremely small warpage or even no warpage effect.

As an example, in the OLED light emitting module according to embodiments of the present disclosure, the first metal layer and the third metal layer in the metal stack can be formed by a material with a higher thermal conductivity coefficient and a lower thermal expansion coefficient. For example, metals having a higher thermal conductivity coefficient such as copper, silver, aluminum or gold can be used. However, due to high costs, using gold as a metal encapsulation material is preferably not considered. At a temperature of 20° C. for example, the thermal expansion coefficients of copper, silver and aluminum are respectively 17.5, 19.5 and 23.2 ppm/° C. Apparently, copper has the lowest thermal expansion coefficient among them. Therefore, in a preferred implementation, the first metal layer and the third metal layer can be chosen as copper layers. In other words, in the OLED light emitting module, the metal stack exhibits such a three layered structure: Cu/Invar/Cu. In table 1 below, as an example, the experimental results of the thermal expansion coefficient and the thermal conductivity coefficient for the entire metal stack are shown in case that there are different thickness ratios between the two copper layers and the invar alloy layer in the center, wherein X-Y plane refers to an extension plane of the metal stack, and Z plane refers to a plane perpendicular to the extension plane.

TABLE 1

| thickness ratios (Cu/invar alloy/Cu) | thermal expansion coefficient (ppm/° C.) | thermal conductivity coefficient (W/(m · K)) | |
|---|---|---|---|
| | | X-Y plane | Z plane |
| 1:8:1 | 4.2 | 89 | 53 |
| 1:3:1 | 6.9 | 164 | |
| 1:2:1 | 8.2 | 186 | |
| 1:1:1 | 10.9 | 230 | |
| pure invar alloy | 0-4 | 10 | 10 |

As can be seen clearly from table 1, by adding copper layers with a same thickness at two opposite sides of the invar alloy, the thermal conductivity is improved considerably in both the extension plane and the perpendicular plane, and meanwhile a relatively lower thermal expansion coefficient can be ensured. As an example, in consideration of a balance between the thermal conductivity and the thermal expansion effect, the thickness ratio between copper/invar alloy/copper in the metal stack can be selected in a range from 1:8:1 to 1:20:1, and in particular 1:8:1 for instance. In a preferred embodiment, the thickness of the two copper layers can be 10 μm, and correspondingly, the thickness of the invar alloy layer in the center can be 80 μm for instance, thereby obtaining a metal stack with an entire thickness of 100 μm. Obviously, other thicknesses for the invar alloy layer can also be selected, for example, in a range from 20 μm to 300 μm. Alternatively, aluminum or silver can also be used for forming the first metal layer and the third metal layer on both sides of the invar alloy layer. As an example, in such a metal stack, the thickness ratio between aluminum/invar alloy/aluminum or silver/invar alloy/silver can fall in a range from 1:8:1 to 1:20:1.

It should be noted here, although different values of the thickness ratio for the metal stack, for example, between copper/invar alloy/copper, aluminum/invar alloy/aluminum or silver/invar alloy/silver, are disclosed in the above depictions, such values are only used as examples for illustrating the present disclosure, rather than limiting the present disclosure, and the present disclosure should not be limited thereto in any sense. In fact, having benefited from the spirit or teaching of the present disclosure, those skilled in the art can choose all other possible thickness ratios by finding a balance between the thermal conductivity and the thermal expansion effects, which should all fall within the protection scope of the present disclosure.

Furthermore, as an example, the metal stack having three sublayers can be formed either integrally, or separately and then assembled. As an example, in an embodiment, the metal stack can be formed integrally by a rolling bonding process, for instance, using invar alloy and aluminum, invar alloy and silver, or invar alloy and copper, such that there is a predetermined thickness ratio between various layers. Alternatively, in a further embodiment, an invar alloy film layer, i.e., the second metal layer located in the center, can be formed first by performing a cold rolling process on the invar alloy, and then two copper layers, two aluminum layers or two silver layers, i.e., the first metal layer and the third metal layer located on both sides, can be formed respectively on both sides of the invar alloy film layer by an electroplating process or an electroless plating process for instance. Those skilled in the art should understand that in embodiments of the present disclosure, the metal stack can also be formed by other suitable processes, and the present disclosure is not limited in this aspect.

In an optional embodiment, the OLED light emitting module can further comprise an adhesive layer 400, which is located between the OLED light emitting device 200 and the metal stack 300, for example, as shown in FIG. 1. Through cooperation with the adhesive layer 400, the metal stack 300 can provide a better encapsulation effect for the OLED light emitting device 200. As an example, the thickness of the adhesive layer 400 can be selected in a range from 30 μm to 80 μm. Usually, the adhesive layer 400 can be formed by a thermoplastic adhesive or a thermosetting adhesive. Exemplarily, the thermoplastic adhesive can comprise any one of polyvinyl acetate, polyvinyl alcohol, polyvinyl formal, polypropylene, polyethylene, polyvinyl chloride, polyurethane, polyamide, and saturated polyester. Alternatively, the thermosetting adhesive can comprise any one of urea resin, phenolic resin, resorcinol resin, melamine resin, epoxy resin, unsaturated polyester, polyisocyanate, and furan resin. Obviously, it should be emphasized that all these examples for the thickness and material of the adhesive layer 400 are only provided for schematically illustrating the present disclosure rather than limiting it, and the present disclosure is intended to cover all other suitable thicknesses and materials for the adhesive layer 400.

Figure 2:
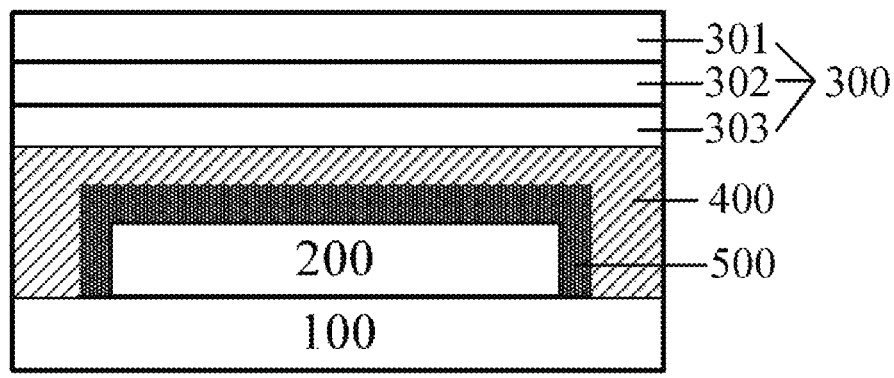
FIG. 2 schematically shows a section view of the OLED light emitting module according to another embodiment of the present disclosure.

Next, referring to FIG. 2, a section view of the OLED light emitting module according to another embodiment of the present disclosure is shown schematically. The OLED light emitting module shown in FIG. 2 has generally the same structure as the OLED light emitting module shown in FIG. 1, and thus the same reference signs are used to indicate the same components. In contrast with FIG. 1, now in FIG. 2, the OLED light emitting module further comprises an additional passivation layer 500, apart from the base substrate 100, the OLED light emitting device 200, the adhesive layer 400 and the metal stack 300. Exemplarily, the passivation layer 500 can provide additional protection for the OLED light emitting device 200 to prevent pollutions from ambient air and so on, such that the optical performance of the entire OLED light emitting module is more stable and reliable.

Figure 3:
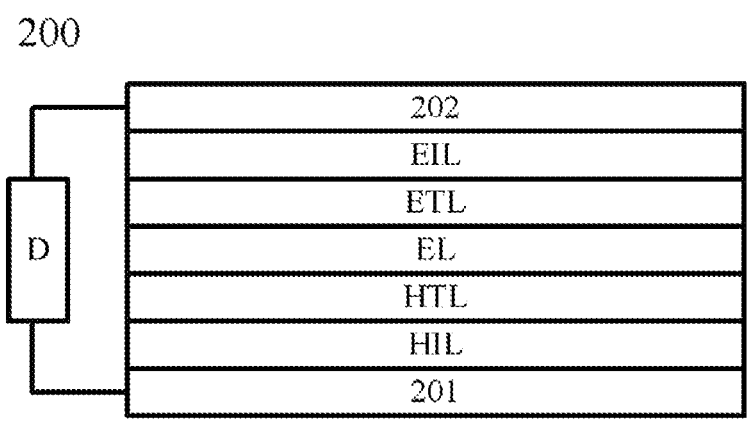
FIG. 3 schematically shows an enlarged section view of an OLED light emitting device used in the OLED light emitting module according to an embodiment of the present disclosure.

For example, referring to FIG. 3, an enlarged section view of an OLED light emitting device used in the OLED light emitting module according to an embodiment of the present disclosure is schematically shown. Specifically, in an optional embodiment of the present disclosure, the OLED light emitting device 200 for the OLED light emitting module can comprise an anode 201, a hole injection layer HIL, a hole transport layer HTL, a light emitting layer EL, an electron transport layer ETL, an electron injection layer EIL and a cathode 202 arranged sequentially in stack; and a driver D for driving the OLED light emitting device 200 to emit light. It should be pointed out here, although the driver D is shown on a side surface of the entire OLED light emitting device 200 as an example, the present disclosure is not limited thereto in any sense. In fact, having benefited from the teaching of the present disclosure, those skilled in the art can easily think of any other positions suitable for disposing the driver D, and the present disclosure is intended to cover all these alternative position solutions. Besides, it should be further noted, although all layer structures of the OLED light emitting device 200 are illustrated above as an example, the present disclosure is not limited thereto in any sense. In other words, those skilled in the art can think of arranging further any other film layer structures in the OLED light emitting device 200 upon specific practice requirements, and the present disclosure is intended to cover all these alternative implementations.

Figure 4:
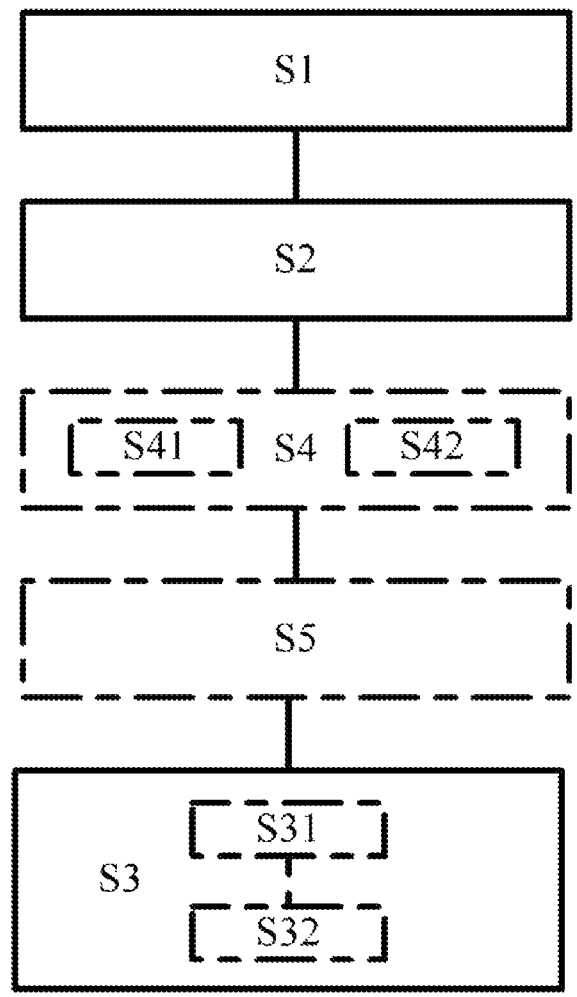
FIG. 4 schematically shows a flow chart of the manufacturing method for an OLED light emitting module according to an embodiment of the present disclosure.

According to another aspect of the present disclosure, a manufacturing method for an OLED light emitting module is further provided. Referring to FIG. 4, a flow chart of the manufacturing method for an OLED light emitting module according to an embodiment of the present disclosure is shown schematically. As shown in FIG. 4, the manufacturing method can comprise steps of: S1, providing a base substrate; S2, forming an OLED light emitting device on the base substrate; and S3, encapsulating the OLED light emitting device with a metal stack. Specifically, in the above manufacturing method, the metal stack can comprise a first metal layer, a second metal layer and a third metal layer arranged in stack, wherein the second metal layer is formed by an invar alloy, and the first metal layer and the third metal layer are formed by a metal material (further optionally, a same metal material) different from the invar alloy.

Furthermore, in an optional embodiment, the manufacturing method for an OLED light emitting module can further comprise: S4, a step of forming a metal stack; and S5, a step of forming a passivation layer on the OLED light emitting device prior to encapsulating the OLED light emitting device with the metal stack. Specifically, the step S4 of forming a metal stack can be accomplished by any of: S41, firstly forming an invar alloy layer by a cold rolling process, and then forming the first metal layer and the third metal layer respectively on two opposite sides of the invar alloy layer by an electroplating process or an electroless plating process; and S42, forming the metal stack by a rolling bonding process such that there is a predetermined thickness ratio between the first metal layer, the second metal layer and the third metal layer. It should be noted here, although two approaches S41 and S42 for forming the metal stack are provided above exemplarily, the present disclosure is not limited thereto in any sense. In fact, according to the technical hint or teaching provided above, those skilled in the art can easily understand any other suitable approaches for forming the metal stack, which are all intended to fall within the protection scope of the present disclosure.

As can be seen, according to the embodiments of the present disclosure, during the process for forming the OLED light emitting module, by encapsulating the OLED light emitting device with a three-layer metal stack comprising an invar alloy layer in the center, the thermal conductivity of the entire light emitting module can be improved, the service life can be prolonged, the production cost can be reduced, and the device thickness can be thinned. By providing outer metal layers for example made of a same material and preferably having a same thickness on both sides of the invar alloy layer in the center, device warpage caused by the thermal expansion of the encapsulation layer can be effectively prevented, and meanwhile a greater thermal conductivity of the encapsulation layer can be ensured.

As a specific implementation, in the manufacturing method for an OLED light emitting module provided by embodiments of the present disclosure, the step S3 of encapsulating the OLED light emitting device with a metal stack can comprise substeps of: S31, bonding an adhesive layer onto the metal stack by a rolling lamination process; and S32, encapsulating the metal stack and the adhesive layer as bonded onto the base substrate by a rolling lamination process or a vacuum assembling process. In this way, with the help of an additional adhesive, the metal stack can provide a better encapsulation effect for the OLED light emitting device, thereby ensure a more stable and reliable optical performance of the entire light emitting module.

In summary, an OLED light emitting module is provided in embodiments of the present disclosure, wherein the core OLED light emitting device is encapsulated by means of a three-layer metal stack comprising an invar alloy. In this case, since the metal stack has a better thermal conductivity than the invar alloy, the resultant OLED light emitting module can achieve a better heat dissipation effect, which helps to prolong the service life of the device. Meanwhile, as compared with a conventional encapsulation glass cover plate, in the OLED light emitting module provided by embodiments of the present disclosure, the metal encapsulation stack boasts lower cost and thinner thickness. As a result, cost of the final OLED light emitting module is reduced significantly and the thickness thereof is thinned considerably, which greatly improves the market competitiveness of the entire device. Besides, what's more important, since the metal sublayers located on both sides of the invar alloy in the metal stack are for example made of a same material and preferably have a same thickness, device warpage caused by the thermal expansion effect of the encapsulation stack can be further inhibited effectively. Furthermore, in another embodiment of the present disclosure, a manufacturing method for an OLED light emitting module is further provided. As compared with the OLED light emitting module described above, the manufacturing method solves the same technical problem and achieves the same beneficial technical effects.

Those skilled in the art should understand that the term "substantially" herein can further comprise embodiments of "entirely", "completely" or "all". Therefore, in embodiments, adjectives can be removed substantially. In a suitable case, the term "substantially" can further involve 90% or higher, such as 95% or higher, and particularly 99% or higher, or even more particularly 99.5% or higher, including 100%. The term "comprise" further comprises embodiments in which the term "comprise" means "consist of". The term "and/or" in particular involves one or more of the items mentioned before and after "and/or". For example, the phrase "item 1 and/or item 2" and similar phrases can involve one or more of item 1 and item 2. The term "comprise" can mean "consist of" in one embodiment, but it can also mean "include at least the defined object and optionally one or more objects" in another embodiment.

Besides, terms such as "first", "second" and "third" in the description and the claims are used to distinguish similar elements rather than necessarily describe the order or the sequence in a temporal aspect. It should be understood that the terms used as such are exchangeable in suitable cases, and the embodiments of this disclosure described herein can be operated in sequences other than the one described or illustrated herein.

Herein, the device is described during operation except for in other aspects. Those skilled in the art will understand that the present disclosure is not limited to the method for operation or the device in operation.

It should be pointed out that the embodiments mentioned above are used to illustrate the present disclosure rather than limit it, and those skilled in the art can design many alternative embodiments without deviating from the scope of the appended claims. In the claims, any reference sign placed within parentheses should not be construed as limiting the claims. The use of the verb "comprise" and inflections thereof do not exclude the presence of elements or steps other than those recited in the claims. The article "one" or "a" before an element does not exclude the presence of a plurality of such elements. The mere fact that certain measures are recited in mutually different dependent claims does not indicate that a combination of these measures cannot be used to advantage.

The present disclosure is further adapted to comprise one or more devices comprised in the characterizing features described in the description and/or shown in the drawings. The present disclosure is further directed at one or more methods or processes comprised in the characterizing features described in the description and/or shown in the drawings.

Various aspects discussed in this patent can be combined to provide additional advantages. Furthermore, some of the features can form the basis of one or more divisional applications.

LIST OF REFERENCE SIGNS

100—base substrate;
200—OLED light emitting device;
201—anode;
HIL—hole injection layer;
HTL—hole transport layer;
EL—light emitting layer;
ETL—electron transport layer;
EIL—electron injection layer;
202—cathode;
300—metal stack;
301—first metal layer;
302—second metal layer;
303—third metal layer;
400—adhesive layer; and
500—passivation layer.

What is claimed is:

1. An organic light-emitting diode (OLED) light emitting module, comprising:
a base substrate;
an OLED light emitting device on the base substrate; and
a metal stack on the OLED light emitting device,
wherein the metal stack comprises a first metal layer, a second metal layer and a third metal layer arranged in stack,
wherein the second metal layer comprises an iron-nickel alloy, wherein the iron-nickel alloy comprises a ratio of 36% nickel and 64% iron,
wherein the first metal layer and the third metal layer comprise a metal material different from the iron-nickel alloy,
wherein the first metal layer and the third metal layer comprise aluminum or silver, and
wherein a thickness of the first metal layer is the same as a thickness of the third metal layer, and a thickness ratio between the first metal layer, the second metal layer and the third metal layer is in a range from about 1:8:1 to about 1:20:1.

2. The OLED light emitting module according to claim 1, wherein the first metal layer and the third metal layer comprise a same metal material.

3. The OLED light emitting module according to claim 1, wherein the OLED light emitting module further comprises an adhesive layer between the OLED light emitting device and the metal stack.

4. The OLED light emitting module according to claim 3, wherein the adhesive layer has a thickness of 30 µm-80 µm.

5. The OLED light emitting module according to claim 3, wherein the OLED light emitting module further comprises a passivation layer between the OLED light emitting device and the adhesive layer.

6. The OLED light emitting module according to claim 4, wherein the OLED light emitting module further comprises a passivation layer between the OLED light emitting device and the adhesive layer.

7. A manufacturing method for an organic light-emitting diode (OLED) light emitting module, comprising:
providing a base substrate;
forming an OLED light emitting device on the base substrate; and
providing a metal stack on the OLED light emitting device,
wherein the metal stack comprises a first metal layer, a second metal layer and a third metal layer arranged in a stack,
wherein the second metal layer is formed by an iron-nickel alloy, wherein the iron-nickel alloy comprises a ratio of 36% nickel and 64% iron,
wherein the first metal layer and the third metal layer are formed by a metal material different from the iron-nickel alloy,
wherein the first metal layer and the third metal layer comprise aluminum or silver, and
wherein a thickness of the first metal layer is the same as a thickness of the third metal layer, and a thickness ratio between the first metal layer, the second metal layer and the third metal layer is in a range from about 1:8:1 to about 1:20:1.

8. The manufacturing method according to claim 7, wherein the first metal layer and the third metal layer are formed by a same metal material.

9. The manufacturing method according to claim 7, further comprising forming the metal stack by operations comprising:
forming an iron-nickel alloy layer by a cold rolling process, and subsequently forming the first metal layer and the third metal layer respectively on opposite sides of the iron-nickel alloy layer by an electroplating process or an electroless plating process.

10. The manufacturing method according to claim 7, further comprising:

forming the metal stack by a rolling bonding process, such that there is a predetermined thickness ratio between the first metal layer, the second metal layer and the third metal layer.

11. The manufacturing method according to claim 7, further comprising:

forming a passivation layer on the OLED light emitting device prior to providing the metal stack on the OLED light emitting device.

12. The manufacturing method according to claim 7, wherein the providing the metal stack on the OLED light emitting device comprises:

bonding an adhesive layer onto the metal stack by a rolling lamination process; and placing the metal stack and the adhesive layer that was bonded onto the base substrate by a rolling lamination process or a vacuum assembling process.

13. A display device, comprising the OLED light emitting module according to claim 1.

* * * * *